United States Patent
Koyama (10) Patent No.: US 8,530,750 B2
(45) Date of Patent: Sep. 10, 2013

(54) MULTILAYER PRINTED CIRCUIT BOARD

(75) Inventor: Kenji Koyama, Tsu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/140,094

(22) PCT Filed: Jan. 28, 2010

(86) PCT No.: PCT/JP2010/051547
§ 371 (c)(1),
(2), (4) Date: Jun. 16, 2011

(87) PCT Pub. No.: WO2010/087506
PCT Pub. Date: Aug. 5, 2010

(65) Prior Publication Data
US 2011/0247869 A1    Oct. 13, 2011

(30) Foreign Application Priority Data

Jan. 30, 2009 (JP) ................. 2009-019297
Dec. 9, 2009 (JP) ................. 2009-279911

(51) Int. Cl.
*H05K 1/00* (2006.01)
(52) U.S. Cl.
USPC ............. 174/258; 361/816; 361/818
(58) Field of Classification Search
USPC ................. 174/258; 361/816, 818
See application file for complete search history.

(56) References Cited

U.S. PATENT DOCUMENTS

| | | | |
|---|---|---|---|
| 6,172,881 B1* | 1/2001 | Hirai | 361/816 |
| 6,507,495 B1 | 1/2003 | Hailey et al. | |
| 6,573,804 B2 | 6/2003 | Hayashi | |
| 6,937,480 B2 | 8/2005 | Iguchi et al. | |
| 7,438,560 B2 | 10/2008 | Takahashi | |

(Continued)

OTHER PUBLICATIONS

Montrose, Mark I., "EMC Design of a Printed Circuit," Nov. 1997, pp. 157-159 (134-136).

(Continued)

*Primary Examiner* — Timothy Thompson
*Assistant Examiner* — Andargie M Aychillhum
(74) *Attorney, Agent, or Firm* — Fitzpatrick, Cella, Harper & Scinto (57) ABSTRACT

A multilayer printed circuit board includes a first conductive layer including (i) a first signal ground, (ii) a first frame ground mounted on an external interface component, (iii) a first slit portion that separates the first signal ground and the first frame ground from each other, and (iv) a signal wiring arranged to extend over the first slit portion. A second conductive layer is laminated on the first conductive layer through a dielectric layer. The second conductive layer includes (i) a second signal ground, (ii) a second frame ground, and (iii) a second slit portion that separates the second signal ground and the second frame ground from each other. A first connecting member and a second connecting member connect the second signal ground and the second frame ground to each other. The first connecting member and the second connecting member are arranged along the signal wiring on a different side, such that the first connecting member and the second connecting member sandwich the signal wiring and extend over the second slit portion.

6 Claims, 10 Drawing Sheets

(56) References Cited

U.S. PATENT DOCUMENTS

2001/0043197 A1 11/2001 Hayashi
2002/0176236 A1 11/2002 Iguchi et al.
2007/0241844 A1* 10/2007 Kim et al. .................. 333/238
2008/0063092 A1 3/2008 Takahashi

OTHER PUBLICATIONS

Chinese Official Action issued Mar. 5, 2013, in counterpart Chinese Patent Application No. 201080005398.8, with an English translation.

Montrose, Mark I. "EMC design of a print circuit, 5.2.2 Method 2: Bridging in a Moat—Partitioning," Nov. 30, 1997, pp. 134-136, with an English translation, pp. 157-159.

Notification Concerning Transmittal of International Preliminary Report on Patentability (Chapter I of the Patent Cooperation Treaty) and Written Opinion of the International Searching Authority, issued Aug. 2, 2011, and mailed in a communication dated Aug. 11, 2011, in counterpart PCT Application No. PCT/JP2010/051547.

* cited by examiner

MULTILAYER PRINTED CIRCUIT BOARD

CLAIM OF PRIORITY

This application claims the benefit of Japanese Patent Application No. 2009-019297, filed on Jan. 30, 2009, and No. 2009-279911, filed on Dec. 9, 2009, which are hereby incorporated by reference herein in their entirety.

TECHNICAL FIELD

The present invention relates to a multilayer printed circuit board that is installed in an electronic device.

BACKGROUND ART

In recent years, along with more size reduction and a higher mold rate of electronic devices, such as printers, an area of a metal housing with which the device is electromagnetically shielded has been reduced. Also, in a printed circuit board, with a higher-density package, a mounted component, such as an LSI, is more miniaturized, and its required voltage is decreased more. The reduction in area of the metal housing, the miniaturization of the LSI, and the decrease in voltage make higher the probability of malfunction of a device circuit due to exogenous noise, such as electrostatic discharge noise (hereafter referred to as "ESD noise").

Figure 9A:
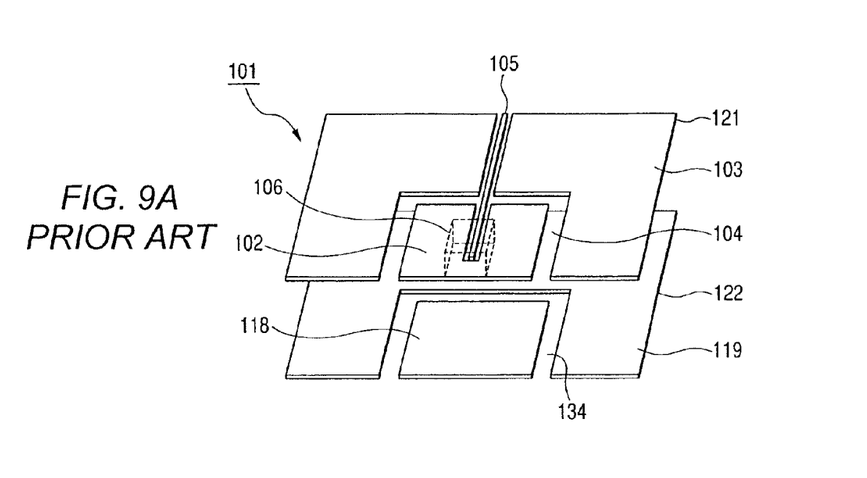
FIGS. 9A and 9B are a plan view and a perspective view, respectively, illustrating a multilayer printed circuit board in a conventional technology.
Figure 9B:
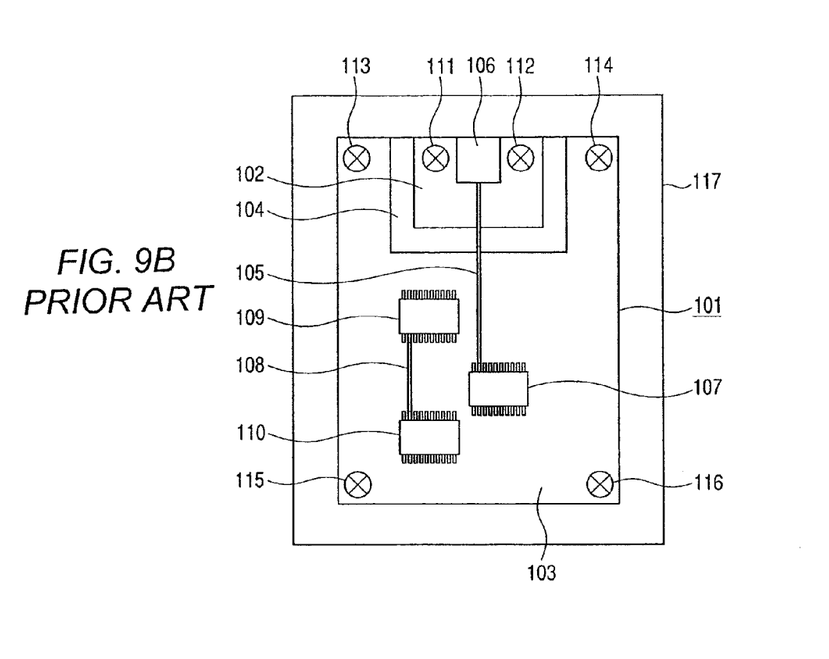

FIGS. 9A and 9B illustrate a configuration for preventing the malfunction caused by the ESD noise in a conventional multilayer printed circuit board 101. FIG. 9A is a plan view, and FIG. 9B is a perspective view. The multilayer printed circuit board 101 is disposed on a metal housing 117, and includes a first conductive layer 121 and a second conductive layer 122. A dielectric layer (not shown) is formed between the first conductive layer 121 and the second conductive layer 122.

In the first conductive layer 121, there are formed a first frame ground pattern (hereafter referred to as "first FG pattern") 102 and a first signal ground pattern (hereafter referred to as "first SG pattern") 103. The first FG pattern 102 and the first SG pattern 103 are separated from each other by a first slit portion 104. On the first FG pattern 102, there is mounted an external interface component 106, such as a connector or a switch. On the first SG pattern 103, there are mounted a first semiconductor device 107, a second semiconductor device 109, and a third semiconductor device 110. The external interface component 106 and the first semiconductor device 107 are connected to each other over the first slit portion 104 by a signal wiring 105. Further, the second semiconductor device 109 and the third semiconductor device 110 are connected to each other by a signal wiring 108. In FIGS. 9A and 9B, respective clearances defined between the signal wirings 105 and 108, and the first FG pattern 102 and the first SG pattern 103, are omitted.

Further, in the second conductive layer 122, a second frame ground pattern (hereafter referred to as "second FG pattern") 118 and a second signal ground pattern (hereafter referred to as "second SG pattern") 119 are formed so as to overlap with the first FG pattern 102 and the first SG pattern 103, respectively. The second FG pattern 118 and the second SG pattern 119 are separated from each other by a second slit portion 134.

The first FG pattern 102 and the second FG pattern 118 are short-circuited by conductive members 111 and 112. Further, the first SG pattern 103 and the second SG pattern 119 are short-circuited by conductive members 113, 114, 115, and 116. The conductive members 111, 112, 113, 114, 115, and 116 can be formed by through-holes or non-through via holes.

In the multilayer printed circuit board illustrated in FIGS. 9A and 9B, it is assumed that the ESD noise is applied to a neighborhood of the external interface component 106. The ESD noise flows into the first FG pattern 102, and also into the second FG pattern 118 from the first FG pattern 102. However, because the first and second FG patterns 102 and 118 are separated from the first and second SG patterns 103 and 119 by the first and second slit portions 104 and 134, respectively, the ESD noise hardly flows into the first and second SG patterns 103 and 119. Accordingly, in the multilayer printed circuit board 101, the semiconductor devices 109 and 110 that transfer a signal through the signal wiring 108 that does not extend over the slit are hardly affected by the ESD noise. Therefore, the semiconductor devices 109 and 110 are very high in resistance to the ESD noise.

However, when a high-speed signal flows in the signal wiring 105 connected to the external interface component 106 over the slit portion 104, a return current path of the high-speed signal is blocked by the first and second slit portions 104 and 134, resulting in a problem that radiation noise increases.

Figure 10A:
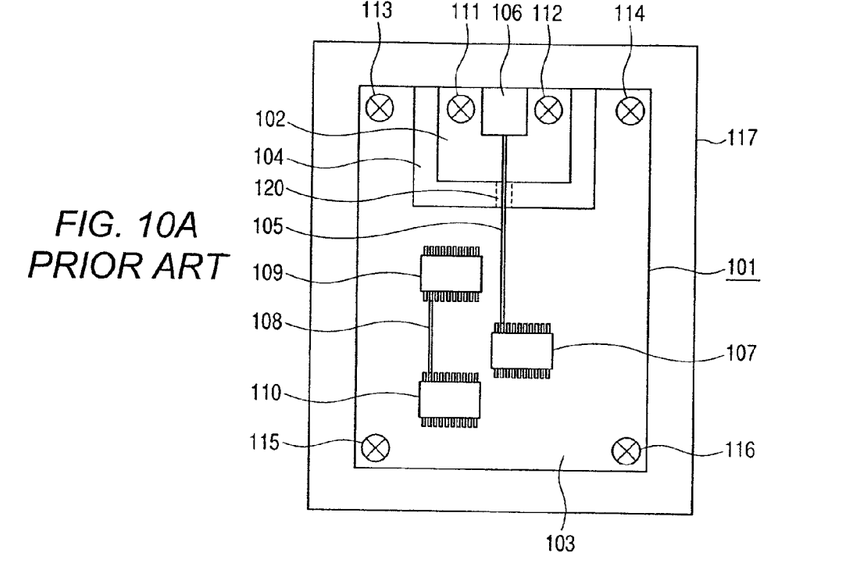
FIGS. 10A and 10B are a plan view and a perspective view, respectively, illustrating a multilayer printed circuit board in a conventional technology.
Figure 10B:
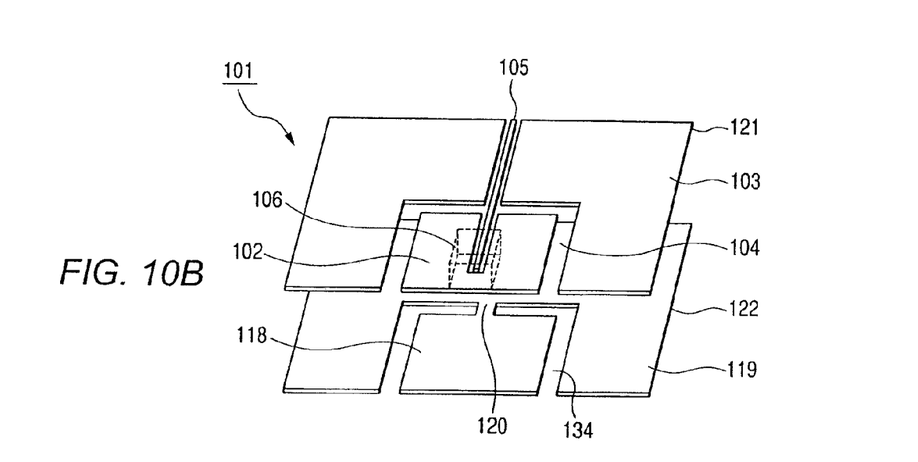

In order to solve the above-mentioned problem, there has been known a configuration disclosed in "EMC design of a printed circuit", pages 134 to 136, written by Mark I. Montrose, published by Ohmsha, November, 1997. FIGS. 10A and 10B illustrate a multilayer printed circuit board having the configuration disclosed in this article, in which FIG. 10A is a plan view, and FIG. 10B is a perspective view. The same members as those in FIGS. 9A and 9B are denoted by identical symbols, and their description is omitted.

In the "EMC design of a printed circuit", article, the second FG pattern 118 and the second SG pattern 119 of the second conductive layer 122 are connected to each other by a connecting member 120 having an electrical conductivity immediately below the signal wiring 105 extending over the first slit portion 104. The connecting member 120 enables the return current path to be ensured, which is formed when a current flows in the signal wiring 105 extending over the first slit portion 104, thereby suppressing the radiation noise.

In the configuration disclosed in the "EMC design of a printed circuit", article, however, when the applied ESD noise flows into the second SG pattern 119 from the second FG pattern 118, the ESD noise is concentrated on the connecting member 120. Then, a magnetic field developed in the connecting member 120 is strongly bound to the signal wiring 105 extending over the first slit portion 104, thereby increasing a propagation quantity of the ESD noise to the signal wiring 105. As a result, a problem arises that a resistance to the ESD noise is deteriorated.

DISCLOSURE OF THE INVENTION

The present invention has an object of providing a multilayer printed circuit board that is high in resistance to exogenous noise, such as ESD noise, and is capable of suppressing radiation noise.

According to the present invention, a multilayer printed circuit board includes a first conductive layer and a second conductive layer formed through a dielectric layer, a signal ground pattern and a frame ground pattern formed in each of the first conductive layer and the second conductive layer, a slit portion formed in each of the first conductive layer and the second conductive layer for separating the signal ground pattern and the frame ground pattern from each other, a signal wiring arranged on the first conductive layer so as to extend over the slit portion, and a first connecting member and a second connecting member for connecting the signal ground pattern and the frame ground pattern along the signal wiring in the second conductive layer, in which the first connecting member and the second connecting member are symmetrically arranged with respect to the signal wiring, such that the first connecting member and the second connecting member sandwich the signal wiring and extend over the slit portion.

Further features of the present invention will become apparent from the following description of exemplary embodiments, with reference to the attached drawings.

BEST MODE FOR CARRYING OUT THE INVENTION

Figure 11:
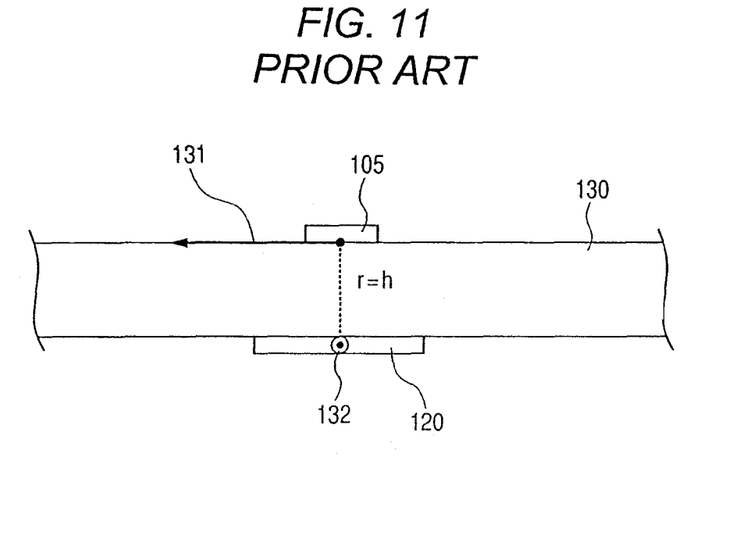
FIG. 11 is a cross-sectional view for illustrating a propagation principle of an ESD noise current in the conventional technology.

First, the principle of propagation of ESD noise to a signal wiring 105 in a conventional multilayer printed circuit board illustrated in FIGS. 10A and 10B is described with reference to FIG. 11. Referring to FIG. 11, a dielectric layer 130 is formed between a first conductive layer 121 and a second conductive layer 122. A center portion of a conductive member 120 is represented by 132, and a direction of an ESD noise current flowing into the second SG pattern 119 from the second FG pattern 118 is a back direction perpendicular to the paper plane. An arrow 131 represents a direction of a magnetic flux B developed at a midpoint of a side of the signal wiring 105 that is in contact with the dielectric layer 130 by the ESD noise current flowing through the center portion 132. The same members as those in FIGS. 9A and 9B are denoted by identical symbols, and their description is omitted.

The ESD noise current flowing in the conductive member 120 gathers at the center portion 132 of the conductive member 120 due to an effect caused by approach of the conductive member 120 and the signal wiring 105. Therefore, when a current flowing in the connecting member 120 is calculated as the current flowing through the center portion 132, a magnetic flux having a magnitude expressed by the following Expression (1) is developed in the direction represented by the arrow 131 at a position of the signal wiring 105.

$$|\vec{B}| = \frac{\mu_0}{4\pi} \frac{I}{h^2}$$ Expression (1)

where μ0 is a magnetic permeability in a vacuum, I is the ESD noise current flowing in the connecting member, and h is a thickness of the dielectric layer 130. The linkage of the magnetic flux develops an induced electromotive force in the signal wiring 105, and allows the ESD noise current to propagate therethrough.

Embodiment 1

Figure 1:
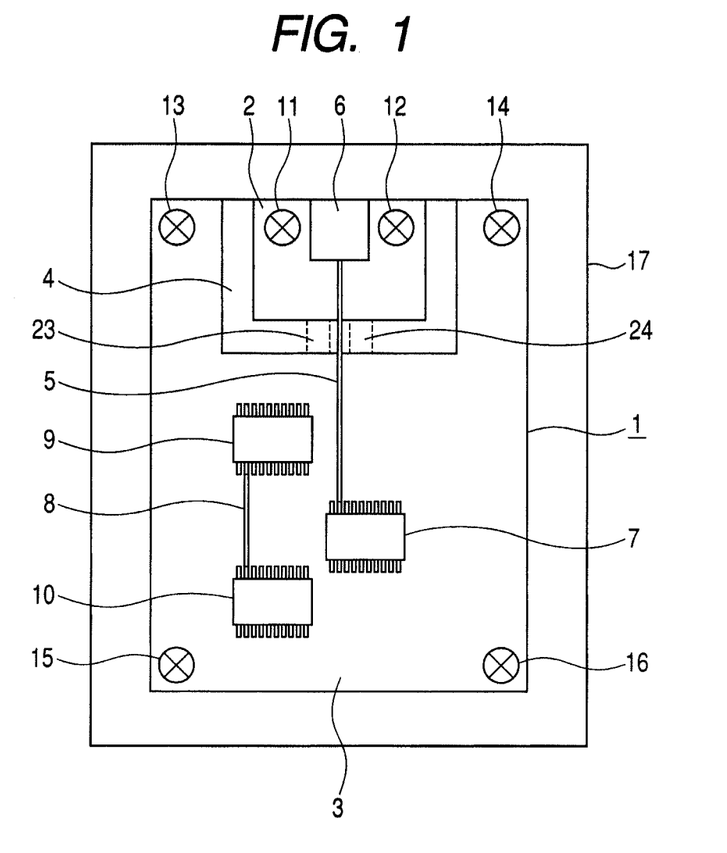
FIG. 1 is a plan view illustrating a multilayer printed circuit board according to a first embodiment.
Figure 2A:
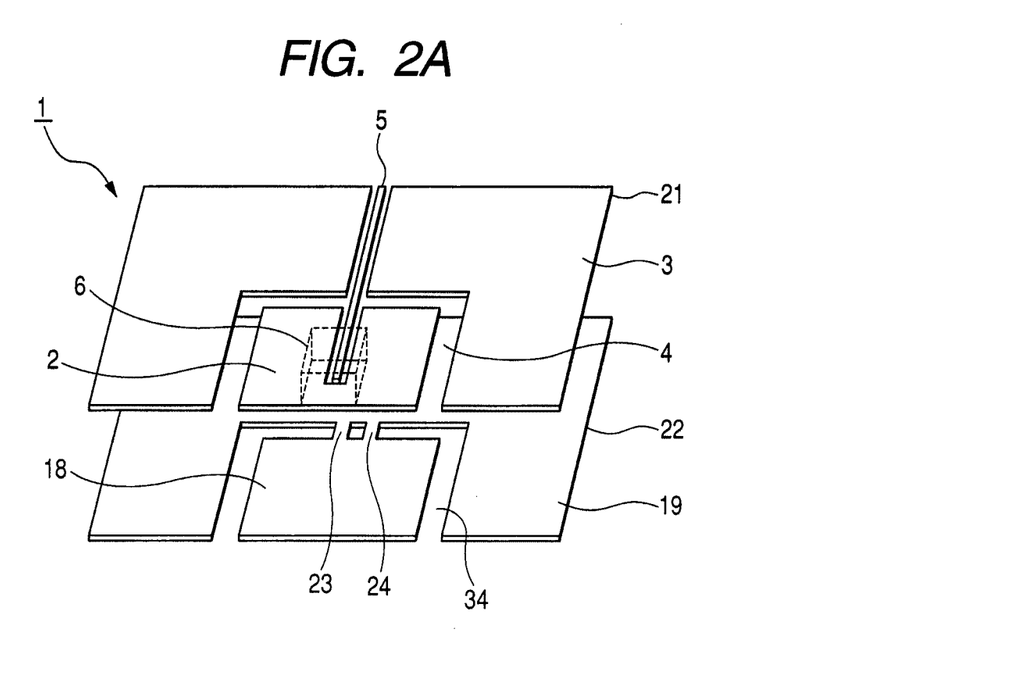
FIGS. 2A and 2B are a perspective view and a cross-sectional view, respectively, illustrating the multilayer printed circuit board according to the first embodiment.
Figure 2B:
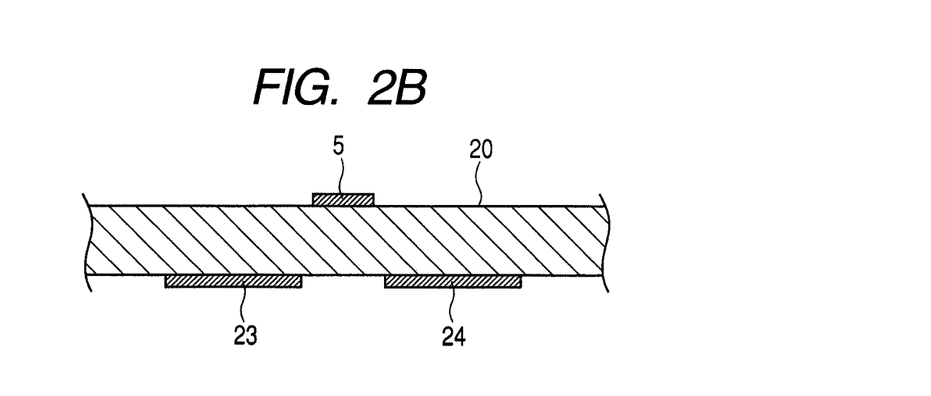

Now, an embodiment of the present invention is described in detail with reference to the accompanying drawings. FIGS. 1, 2A, and 2B illustrate a printed circuit board according to a first embodiment of the present invention, in which FIG. 1 is a plan view, FIG. 2A is a perspective view illustrating two conductive layers being separated, and FIG. 2B is a partially cross-sectional view illustrating only a neighborhood of a signal wiring. As illustrated in FIG. 2A, a multilayer printed circuit board 1 includes a first conductive layer 21 and a second conductive layer 22. Further, a dielectric layer 20 is formed between the first conductive layer 21 and the second conductive layer 22.

A first frame ground pattern (hereafter referred to as "first FG pattern") 2 and a first signal ground pattern (hereafter referred to as "first SG pattern") 3 are formed in the first conductive layer 21. The first FG pattern 2 and the first SG pattern 3 are separated from each other by a first slit portion 4. An external interface component 6, such as a connector or a switch, is mounted on the first FG pattern 2. A first semiconductor device 7, a second semiconductor device 9, and a third semiconductor device 10 are mounted on the first SG pattern 3. The external interface component 6 and the first semiconductor device 7 are connected to each other by a signal wiring 5 over the first slit portion 4. Further, the second semiconductor device 9 and the third semiconductor device 10 are connected to each other by a signal wiring 8.

Further, a second frame ground pattern (hereafter referred to as "second FG pattern") 18 and a second signal ground pattern (hereafter referred to as "second SG pattern") 19 are formed in the second conductive layer 22 so as to overlap with the first FG pattern 2 and the first SG pattern 3, respectively. The second FG pattern 18 and the second SG pattern 19 are separated from each other by a second slit portion 34. Connecting members 23 and 24 that connect the second FG pattern 18 and the second SG pattern 19 are disposed at portions of the second slit portion 34 below the signal wiring 5 extending over the first slit portion 4. Connecting members 23 and 24 are arranged along the signal wiring 5 in a different side so as to extend over the second slit portion 34.

The first FG pattern 2 and the second FG pattern 18 are short-circuited by conductive members 11 and 12. Further, the first SG pattern 3 and the second SG pattern 19 are short-circuited by conductive members 13, 14, 15, and 16. The conductive members 11, 12, 13, 14, 15, and 16 can be formed by through-holes or non-through via holes. Further, a screw that fastens the multilayer printed circuit board 1 to a metal housing 17 may be used for the conductive members 13, 14, 15, and 16.

In the metal housing 17, it is assumed that ESD noise is applied to a neighborhood of the external interface component 6. As described above, the ESD noise flows into the first and second FG patterns 2 and 18, and most of the ESD noise flows into the metal housing 17 through the conductor members 11 and 12. A part of the ESD noise, however, flows into the second SG pattern 19 through the connecting members 23 and 24. In this situation, with the provision of the two connecting members having electrical conductivity, the ESD noise is dispersed into two pieces, and a magnetic flux developed from each connecting member is reduced.

Further, the respective magnetic fluxes developed from the first and second connecting members 23 and 24 have opposite components at a position where the magnetic fluxes are linked with the signal wiring 5, and hence, the magnetic fluxes cancel each other, so that the magnetic flux that is linked with the signal wiring 5 is reduced. As a whole, because the magnetic flux that is linked with the signal wiring 5 is reduced, the ESD noise induced by the signal wiring 5 to flow into the semiconductor device 7 is reduced, and the resistance to static electricity is improved.

Figure 3:
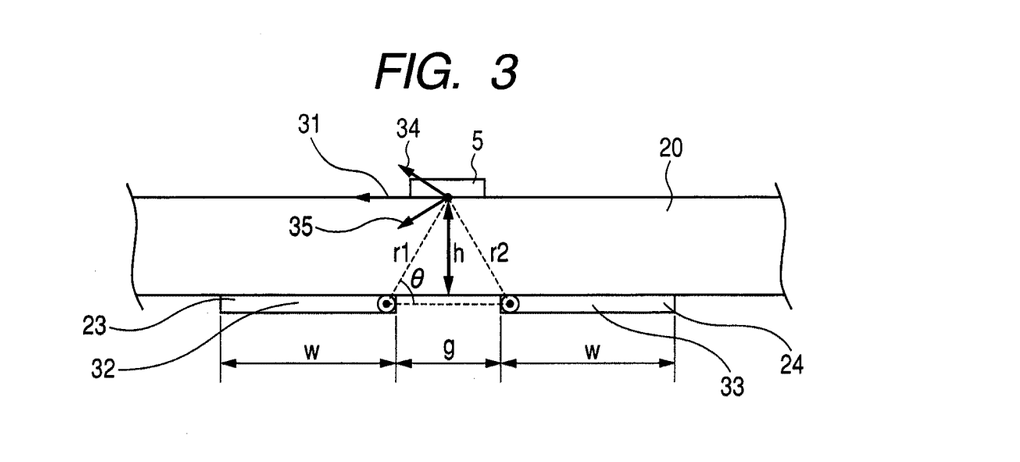
FIG. 3 is a cross-sectional view for illustrating a propagation principle of an ESD noise current according to the first embodiment.

Now, the principle of propagation of the ESD noise to the signal wiring 5 in the multilayer printed circuit board illustrated in FIG. 1 is described in detail with reference to FIG. 3. In FIG. 3, the connecting members 23 and 24 have the same width, and are arranged symmetrically with respect to the signal wiring 5. In FIG. 3, the connecting member 23 has an end 32 located closest to the connecting member 24, and a direction of the ESD noise current flowing in the end 32 is a back direction perpendicular to the paper plane. An arrow 34 represents a direction of a magnetic flux B1 developed at a midpoint of a side of the signal wiring 5, which is in contact with the dielectric layer 20 by the ESD noise current flowing in the end 32. The connecting member 24 has an end 33 located closest to the connecting member 23, and a direction of the ESD noise current flowing in the end 33 is a back direction perpendicular to the paper plane. An arrow 35 represents a direction of a magnetic flux B2 developed at the midpoint of the side of the signal wiring 5, which is in contact with the dielectric layer 20 by the ESD noise current flowing in the end 33. An arrow 31 represents a direction of a synthetic magnetic flux B' of the magnetic flux B1 and the magnetic flux B2.

At this time, due to the effect caused by approach of the connecting members 23 and 24, the ESD current noise flowing the connecting members 23 and 24 gathers at the end 32 where the connecting member 23 is closest to the connecting member 24, and the end 33 where the connecting member 24 is closest to the connecting member 23. Therefore, the principle about current flowing to the end 32 of the connecting member 23 and the end 33 of the connecting member 24 will be explained.

An electromagnetic noise current (1) applied to the first FG pattern 18 is distributed into two currents by the first and second connecting members 23 and 24, and if the configurations of the connecting members 23 and 24 are identical with each other, a magnitude of the ESD noise current flowing in the respective connecting members 23 and 24 becomes ½. In this case, the magnitudes of the magnetic fluxes B1 and B2 that are linked with the signal wiring 5 are equal to each other, and the magnitude is expressed by the following Expression (2).

$$|\vec{B}| = \frac{\mu_0}{4\pi} \frac{I/2}{\left\{ h^2 + \left(\frac{g}{2}\right)^2 \right\}} \quad \text{Expression (2)}$$

where h is a thickness of the dielectric layer 130, and g is a width of a clearance between the connecting members 23 and 24. θ is an angle formed by a line that connects the end 32 of the connecting member 23 and the center point of the signal wiring 5, and a line that connects the end 32 of the connecting member 23 and the end 33 of the connecting member 24. Because the connecting members 23 and 24 are arranged symmetrically with respect to the signal wiring 5, an angle formed by a line that connects the end 33 of the connecting member 24 and the center point of the signal wiring 5, and a line that connects the end 33 of the connecting member 24 and the end 32 of the connecting member 23 is also θ.

The synthetic magnetic flux B' of the magnetic flux B1 and the magnetic flux B2 is expressed by the following Expression (3).

$$\vec{B}' = \vec{B}_1 + \vec{B}_2 |\vec{B}_1|\sin(90°-\theta) - |\vec{B}_2|\sin(90°-\theta) + |\vec{B}_2|\cos(90°-\theta) \quad \text{Expression (3)}$$

When Expression (3) is modified, the component of cos θ is canceled as expressed by the following Expression (4).

$$|\vec{B}'| = |\vec{B}_1|\sin\theta + |\vec{B}_1|\cos\theta + |\vec{B}_2|\sin\theta - |\vec{B}_2|\cos\theta = 2|\vec{B}_1|\sin\theta \quad \text{Expression (4)}$$

The magnitude of the synthetic magnetic flux B' is expressed from Expressions (1) to (4) by the following Expression (5).

$$|\vec{B}'| = 2|\vec{B}_1|\sin\theta = \frac{\sin\theta}{\left\{1 + \frac{g^2}{4h^2}\right\}} \times |\vec{B}| \quad \text{Expression (5)}$$

The coefficient component of the right side in Expression (5) is expressed by the following Expression (6) in a range of 0<θ<90°.

$$0 < \frac{\sin\theta}{\left[1 + \frac{g^2}{4h^2}\right]} < 1 \quad \text{Expression (6)}$$

The following Expression (7) is satisfied.

$$|B'| < |B| \quad \text{Expression (7)}$$

That is, it is found that the magnitude of the synthetic magnetic flux B' in the configuration illustrated in FIG. 3 is smaller than that of the magnetic flux B in the configuration illustrated in FIG. 11. That is, because the ESD noise that propagates to the signal wiring can be reduced, the result is that the resistance to the ESD noise in the printed circuit board can be improved.

(Experiment 1)

Figure 4:
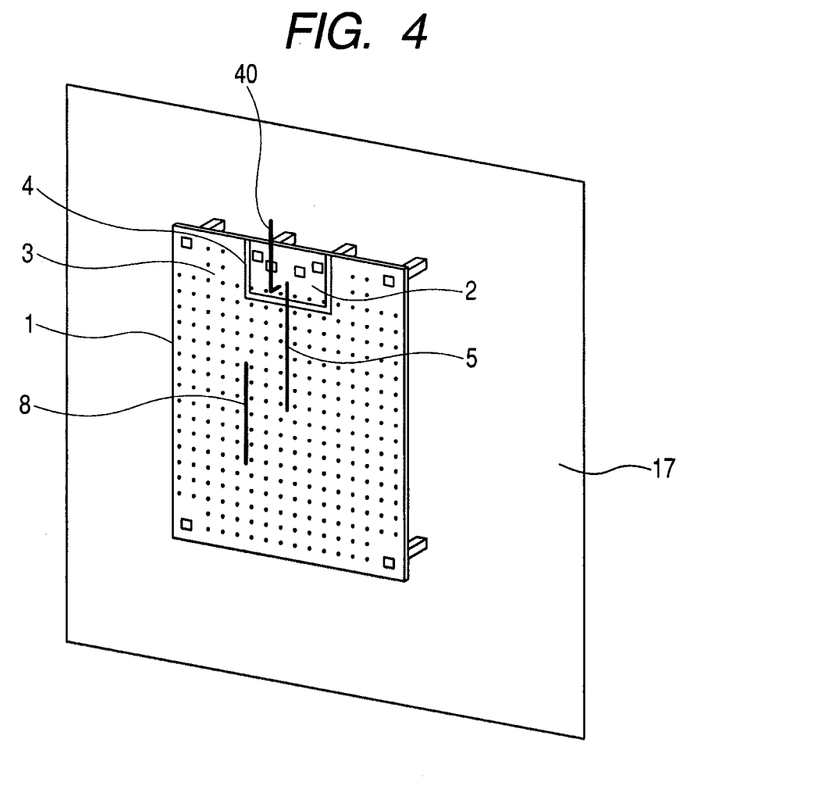
FIG. 4 is a perspective view illustrating a simulation model in Experiment 1.

For the purpose of describing the advantages of this embodiment, an electromagnetic field simulation of the printed circuit board illustrated in FIG. 1 was implemented. FIG. 4 illustrates a model used in the electromagnetic field simulation. In FIG. 4, the same members as those in FIG. 1 are denoted by identical symbols. The printed circuit board 1 is of a rectangular shape that is 100 mm in the long side and 80 mm in the short side, and of a structure having first and second conductive layers that are 50 μm in thickness, and a dielectric layer interposed therebetween, which is 200 μm in thickness and 4.3 in dielectric constant. Two connecting members are 2 mm in width, and arranged symmetrically with respect to the signal wiring 5 with a clearance of 0.5 mm therebetween. The first FG pattern 2 and the first SG pattern 3 are separated by the first slit portion 4 that is 2 mm in width. Further, the second FG pattern and the second SG pattern are also separated by the second slit portion that is 2 mm in width. As a wave source, a Gaussian pulse having an intensity of 1 W at a frequency of 0 to 3 GHz, which simulated the ESD noise, was applied to the first FG pattern 2. Each of the signal wirings 5 and 8 is of a micro strip line structure that is 0.3 mm in width and 30 mm in length, and is terminated to the first conductive layer 21 with a resistance of 50 Ω.

Figure 5A:
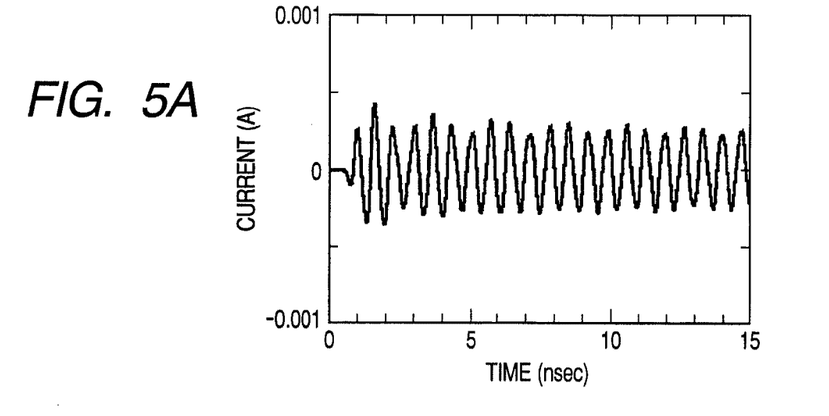
FIGS. 5A, 5B, and 5C are graphs each illustrating a value and a reduction effect of an ESD noise current.

Under the above-mentioned conditions, a simulation was executed, and the resultant ESD noise current that propagated to the signal wiring 5 is illustrated in FIG. 5A. In FIG. 5A, the axis of the abscissa represents time, and the axis of the ordinate represents a value of the ESD noise current.

(Comparative Experiment 1)

Figure 5B:
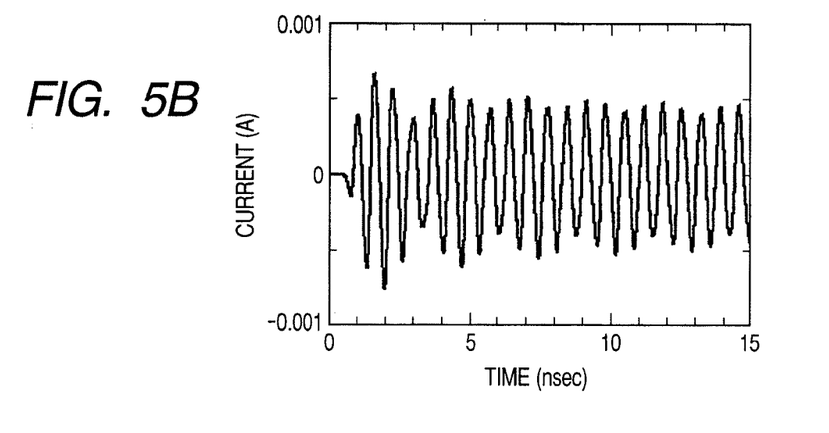

For comparison, in the conventional printed circuit board illustrated in FIGS. 10A and 10B, the ESD noise current that propagated to the signal wiring 105 was simulated as in Experiment 1. A difference of Comparative Experiment 1 from Experiment 1 resides in that the number of connecting members disposed on the second conductive layer 122 is one, and the connecting member is located immediately below the signal wiring 105. The width of the connecting member 120 is 2 mm. With the above-mentioned configuration, the electromagnetic field simulation was implemented as in Experiment 1, and the resultant ESD noise current that propagated to the signal wiring 105 is illustrated in FIG. 5B. When FIG. 5A is compared with FIG. 5B, it is found that the amount of ESD noise current that propagates to the signal wiring 5 in FIG. 5A is less than that in FIG. 5B. That is, as compared with Comparative Experiment 1, the resistance to the ESD noise is high in Experiment 1.

Further, a change in the ESD noise current that flowed in the signal wiring occurring when the arrangement of the first and second connecting members 23 and 24 was changed was simulated, and a relationship between the arrangement of the connecting member and the effect of reducing the ESD noise current was investigated. The same simulation model as that used in Experiment 1 was used. A clearance (r1) between the signal wiring 5 and the end 32 of the first connecting member 23, and a clearance (r2) between the signal wiring 5 and the end 33 of the second connecting member 24 was changed to calculate the ESD noise current flowing in the signal wiring 5 extending over the slit portion 4. In this Comparative Experiment 1, the connecting members 23 and 24 have the same wiring width, and are arranged symmetrically with respect to the signal wiring 5. Therefore, the clearances are represented by a common value r.

Figure 5C:
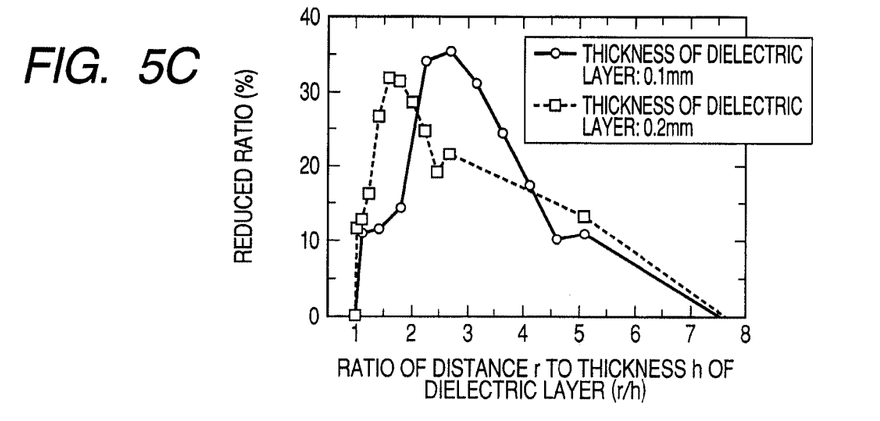

The results are illustrated in FIG. 5C. In FIG. 5C, the axis of the abscissa is a ratio of the distance r being the above-mentioned common value to a thickness h of the dielectric layer when viewed from a cross section perpendicular to the wiring direction of the signal wiring 5. The axis of the ordinate is a reduced ratio of the ESD noise current according to the present invention when it is assumed that the ESD noise current in the conventional technology is 100. It is understood from FIG. 5C that the ESD noise reduction effect is attained when the distance r is larger than the thickness h of the dielectric layer, and equal to or less than 7.5 times. Further, preferably, it is found that the ESD noise reduction effect of 10% or higher is attained when the distance r is equal to or larger than 1.1 times and equal to or less than 5.0 times as large as the thickness h of the dielectric layer.

Further, in this Comparative Experiment 1, the case has been described in which the two connecting members 23 and 24 of the same conductive layer 22 have the same wiring width, and are arranged symmetrically with respect to the signal wiring 5. In this case, because the clearance (r1) between the signal wiring 5 and the first connecting member 23 and the clearance (r2) between the signal wiring 5 and the second connecting member 24 become equal to each other, the component of cos θ in Expression (3) described above can be completely canceled. That is, the vertical component of the magnetic flux of FIG. 3 can be completely canceled, and the ESD noise current can be most effectively suppressed.

However, the present invention is not limited to the configuration in which the two connecting members 23 and 24 have the same wiring width, and are arranged symmetrically with respect to the signal wiring 5, but is applicable to other configurations, as long as the above-mentioned distances r1 and r2 are larger than the thickness h of the dielectric layer, and equal to or less than 7.5 times.

Further, the return current path of the signal flowing in the signal wiring 5 extending over the slit portion 4 is ensured by arranging the connecting members 23 and 24 on the second conductive layer 22, and hence, the suppressing effect of the radiation noise can be maintained.

Embodiment 2

Figure 6:
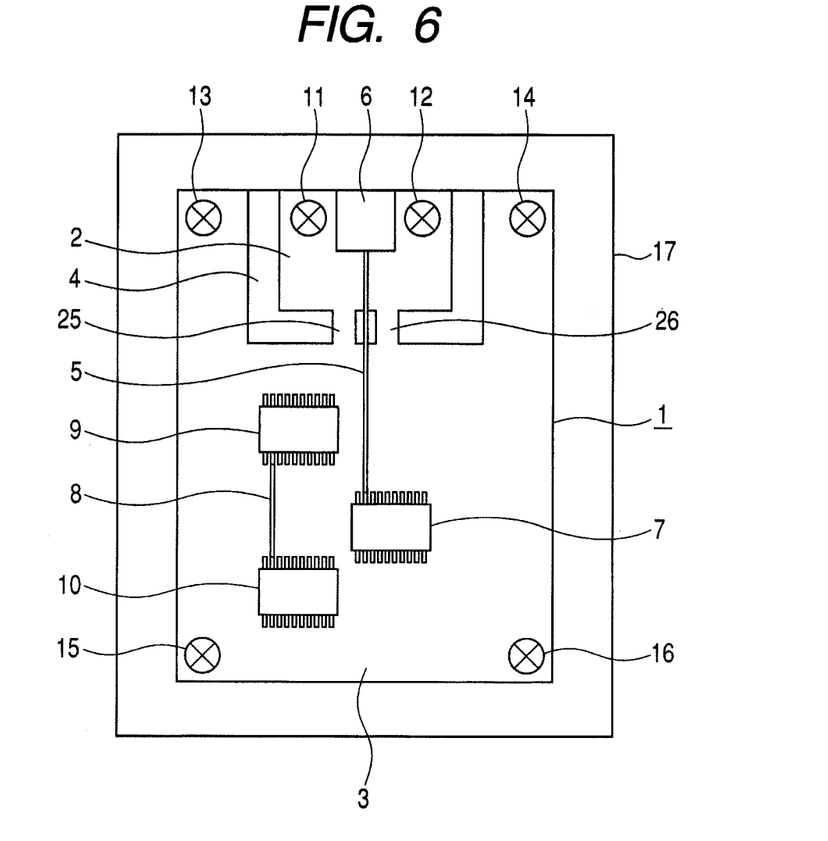
FIG. 6 is a plan view illustrating a multilayer printed circuit board according to a second embodiment.
Figure 7A:
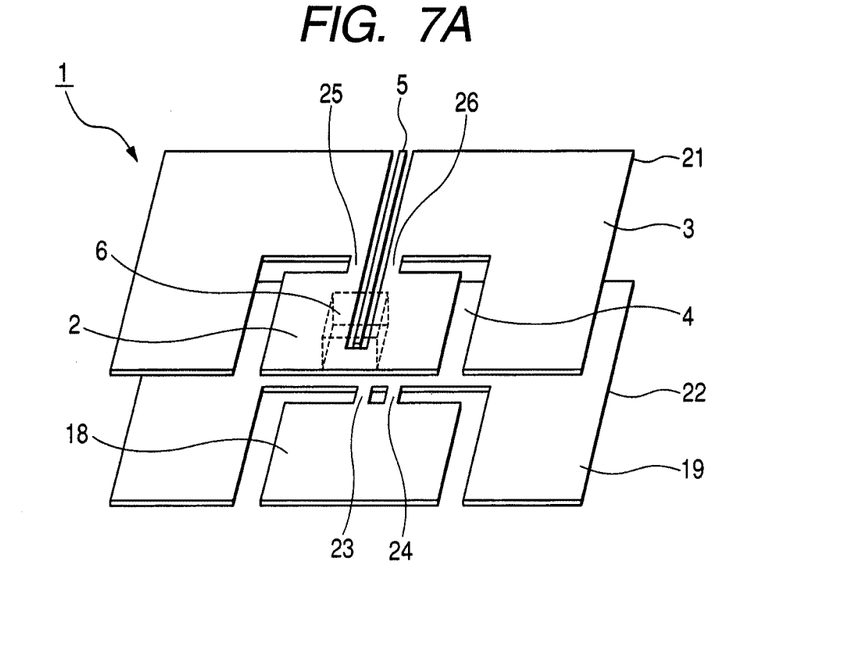
FIGS. 7A and 7B are a perspective view and a cross-sectional view, respectively, illustrating the multilayer printed circuit board according to the second embodiment.
Figure 7B:
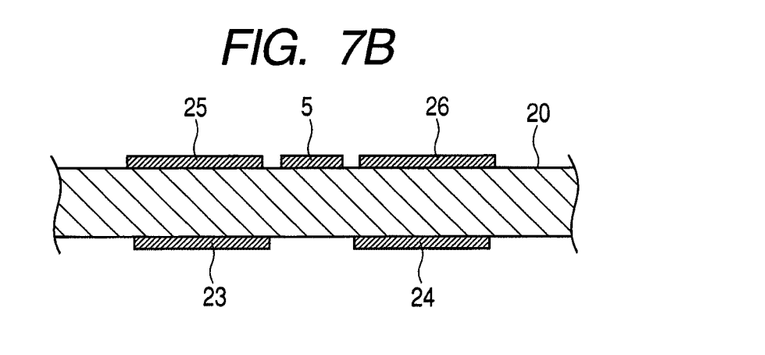

FIGS. 6, 7A, and 7B illustrate a printed circuit board according to a second embodiment of the present invention, in which FIG. 6 is a plan view, FIG. 7A is a perspective view illustrating two conductive layers being separated, and FIG. 7B is a partially cross-sectional view illustrating only a neighborhood of a signal wiring.

This embodiment is different from the first embodiment illustrated in FIG. 1 only in that the first FG pattern 2 and the first SG pattern 3 are connected to each other through third and fourth connecting members 25 and 26 having the electrical conductivity in the first conductive layer 21. The third and fourth connecting members 25 and 26 extend in the wiring direction of the signal wiring 5, and are arranged symmetrically with respect to the signal wiring 5.

With the arrangement of the four connecting members 23, 24, 25, and 26 having the electrical conductivity, the ESD noise is further dispersed, and the magnetic flux developed from each connecting member is further reduced as compared with Embodiment 1. Further, the magnetic fluxes developed from the third and fourth connecting members 25 and 26 disposed on the conductive layer 21 have the opposite components at positions where those magnetic fluxes are linked with the signal wiring 5. Therefore, the magnetic fields are canceled, and the magnetic flux that is linked with the signal wiring 5 is reduced. As a whole, because the amount of magnetic flux that is linked with the signal wiring 5 can be further reduced, the ESD noise induced by the signal wiring 5 to flow into the semiconductor device 7 is reduced, and the resistance to the static electricity is further improved.

(Experiment 2)

For the purpose of describing the advantages of Embodiment 2, an electromagnetic field simulation of the multilayer printed circuit board was implemented as in Experiment 1.

In Experiment 2, in addition to the configuration of Experiment 1, the third and fourth connecting members 25 and 26 are arranged on the first conductive layer 21. The third and fourth connecting members 25 and 26 are 2 mm in width, and arranged symmetrically with respect to the signal wiring 5 with clearances of 0.9 mm from the first conductive layer 21. The electromagnetic field simulation was implemented with the above-mentioned configuration as in Experiment 1, and the resultant ESD noise current that propagated to the signal wiring 5 is illustrated in FIG. 8.

Figure 8:
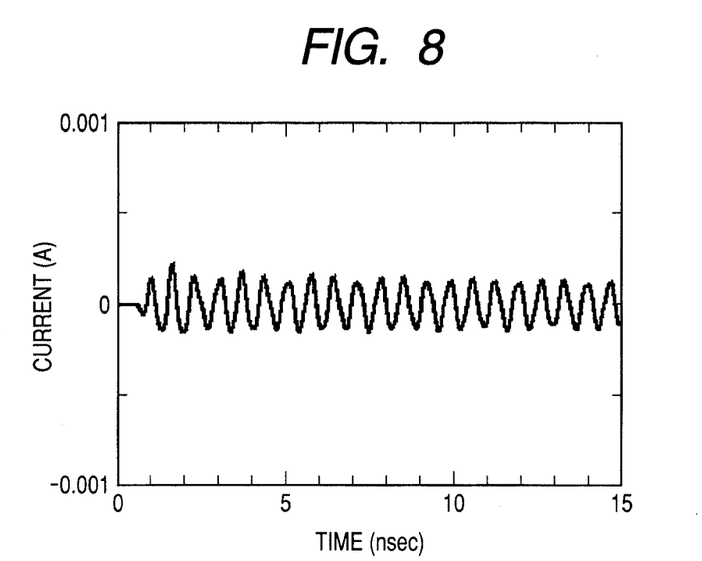
FIG. 8 is a graph illustrating a value of an ESD noise current in Experiment 2.

When FIG. 8 is compared with FIG. 5A, it is found that the amount of ESD noise current that propagates to the signal wiring 5 is further reduced in the configuration of Experiment 2 as compared with Experiment 1. That is, the configuration of Experiment 2 further improves the resistance to the ESD noise.

In this case, it is desirable that the two connecting members 25 and 26 arranged on the same conductive layer 21 come as close to the signal wiring 5 as possible. Further, when the third and fourth connecting members 25 and 26 have the same wiring width, the symmetry of developed magnetic fluxes is improved. Therefore, the effect of canceling the magnetic fields is further improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A multilayer printed circuit board comprising:
   (A) a first conductive layer including:
      (i) a first signal ground;
      (ii) a first frame ground on which an external interface component is mounted;
      (iii) a first slit portion that separates the first signal ground and the first frame ground from each other; and
      (iv) a signal wiring arranged to extend over the first slit portion; and
   (B) a second conductive layer laminated on the first conductive layer through a dielectric layer, the second conductive layer including:
      (i) a second signal ground;
      (ii) a second frame ground; and
      (iii) a second slit portion that separates the second signal ground and the second frame ground from each other, and
   (C) a first connecting member and a second connecting member for connecting the second signal ground and the second frame ground to each other,
   wherein the first connecting member and the second connecting member are arranged along the signal wiring on a different side, such that the first connecting member and the second connecting member sandwich the signal wiring and extend over the second slit portion,
   wherein, in a cross section perpendicular to a wiring direction of the signal wiring, a distance between a midpoint of a side of the signal wiring that is in contact with the dielectric layer and an end of the first connecting member located closest to the second connecting member, and a distance between the midpoint and an end of the second connecting member located closest to the first connecting member, are (i) each larger than a thickness of the dielectric layer, and (ii) equal to or less than 7.5 times the thickness.

2. The multilayer printed circuit board according to claim 1, wherein the first connecting member and the second connecting member have the same wiring width, and are located symmetrically with respect to the signal wiring.

3. The multilayer printed circuit board according to claim 1, wherein, in a cross section perpendicular to a wiring direction of the signal wiring, a distance between a midpoint of a side of the signal wiring which is in contact with the dielectric layer and an end of the first connecting member located closest to the second connecting member, and a distance between the midpoint and an end of the second connecting member located closest to the first connecting member, are each (i) 1.1 times or more and (ii) 5.0 times or less a thickness of the dielectric layer.

4. The multilayer printed circuit board according to claim 1,
   wherein the first signal ground and the first frame ground are connected by a third connecting member and a fourth connecting member, and
   wherein the third connecting member and the fourth connecting member are symmetrically arranged along the signal wiring on a different side, such that the first connecting member and the second connecting member sandwich the signal wiring and extend over the first slit portion.

5. The multilayer printed circuit board according to claim 4, wherein the third connecting member and the fourth connecting member have the same wiring width.

6. The multilayer printed circuit board according to claim 1, wherein a semiconductor device is mounted on the first signal ground, and the external interface component and the semiconductor device are connected to each other by the signal wiring.

* * * * *